US011228312B1

(12) United States Patent
Ponna et al.

(10) Patent No.: US 11,228,312 B1
(45) Date of Patent: Jan. 18, 2022

(54) WIDE VOLTAGE RANGE LEVEL SHIFTER WITH REDUCED DUTY CYCLE DISTORTION ACROSS OPERATING CONDITIONS

(71) Applicant: QUALCOMM Incorporated, San Diego, CA (US)

(72) Inventors: Narender Ponna, Bangalore (IN); Sharad Kumar Gupta, Bangalore (IN); Akhtar Alam, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/930,151

(22) Filed: Jul. 15, 2020

(51) Int. Cl.
*H03K 19/003* (2006.01)
*H03K 19/017* (2006.01)
*H03K 19/0185* (2006.01)

(52) U.S. Cl.
CPC . *H03K 19/00315* (2013.01); *H03K 19/01721* (2013.01); *H03K 19/018528* (2013.01)

(58) Field of Classification Search
None
See application file for complete search history.

(56) References Cited

U.S. PATENT DOCUMENTS

| | | | | |
|---|---|---|---|---|
| 5,426,383 A * | 6/1995 | Kumar | .............. | H03K 19/09441 326/119 |
| 5,929,680 A * | 7/1999 | Lim | ................... | H03K 19/0013 327/264 |
| 6,307,398 B2 * | 10/2001 | Merritt | ............. | H03K 3/356017 326/68 |
| 6,370,071 B1 * | 4/2002 | Lall | .......................... | G11C 8/08 326/81 |
| 6,445,210 B2 | 9/2002 | Nojiri | | |
| 6,998,879 B2 | 2/2006 | Kajimoto | | |
| 7,095,272 B2 | 8/2006 | Morishita | | |
| 7,154,293 B2 * | 12/2006 | Muraya | .......... | H03K 19/018521 326/17 |
| 7,352,209 B2 | 4/2008 | Hsu et al. | | |
| 7,511,552 B2 | 3/2009 | Ali et al. | | |
| 7,956,642 B2 | 6/2011 | Lee | | |
| 8,334,719 B2 * | 12/2012 | Koyama | ............. | H01L 29/7869 327/427 |

\* cited by examiner

*Primary Examiner* — Amy Cohen Johnson
*Assistant Examiner* — James H Cho
(74) *Attorney, Agent, or Firm* — Loza & Loza, LLP

(57) ABSTRACT

According to certain aspects, a level shifter includes a first branch including a first pull-up transistor configured to pull up a first node, and a first pull-down transistor configured to pull down the first node. The level shifter also includes a second branch including a second pull-up transistor configured to pull up a second node, and a second pull-down transistor configured to pull down the second node. The level shifter further includes a third branch including a third pull-up transistor configured to pull up a third node, and a third pull-down transistor configured to pull down the third node. The first branch is cross coupled with the third branch, the second branch is cross coupled with the third branch, the first pull-down transistor has a first channel width, the second pull-down transistor has a second channel width, and the first channel width is greater than the second channel width.

16 Claims, 10 Drawing Sheets

710

| Conditions | Level Shifter | Min. DCD | Max. DCD | 3-Sigma DCD |
|---|---|---|---|---|
| Across up/down conditions | First Shifter | -10.7% | 5.5% | 21.5% |
| | Second Shifter | -3.4% | 4.7% | 11.8% |
| Across upshift conditions | First Shifter | -10.7% | 3.3% | 21.5% |
| | Second Shifter | -3.4% | 4.7% | 11.8% |
| Across downshift conditions | First Shifter | -0.9% | 5.5% | 15.0% |
| | Second Shifter | -2.1% | -0.7% | 5.7% |

| Upshift Conditions | | | |
|---|---|---|---|
| Process Corner | Vdd1 | Vdd2 | Freq. |
| fsg | 0.51 | 0.51 | 768M |
| fsg | 0.51 | 0.575 | 1G |
| fsg | 0.51 | 0.675 | 1.6G |
| fsg | 0.51 | 0.77 | 2.3G |
| sfg | 0.51 | 0.51 | 768M |
| sfg | 0.51 | 0.575 | 1G |
| sfg | 0.51 | 0.675 | 1.6G |
| sfg | 0.51 | 0.77 | 2.3G |
| ttg | 0.51 | 0.89 | 3G |

| Downshift Conditions | | | |
|---|---|---|---|
| Process Corner | Vdd1 | Vdd2 | Freq. |
| fsg | 0.51 | 0.51 | 768M |
| fsg | 0.575 | 0.51 | 768M |
| fsg | 0.675 | 0.51 | 768M |
| fsg | 0.77 | 0.51 | 768M |
| sfg | 0.51 | 0.51 | 768M |
| sfg | 0.575 | 0.51 | 768M |
| sfg | 0.675 | 0.51 | 768M |
| sfg | 0.77 | 0.51 | 768M |
| ttg | 0.89 | 0.51 | 768M |

FIG. 7C

WIDE VOLTAGE RANGE LEVEL SHIFTER WITH REDUCED DUTY CYCLE DISTORTION ACROSS OPERATING CONDITIONS

BACKGROUND

Field

Aspects of the present disclosure relate generally to voltage level shifters, and more particularly, to voltage level shifters with reduced duty cycle distortion.

Background

A system, e.g. a system on a chip (SoC), may include different voltage domains, where each voltage domain may correspond to a different supply voltage. In this regard, the system may include one or more voltage level shifters to facilitate communication between circuits in different voltage domains. For example, a voltage level shifter may allow a signal (e.g. a data signal, a clock signal etc.) to cross from a first voltage domain to a second voltage domain by shifting (e.g., increasing or decreasing) the voltage level of the signal.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a level shifter. The level shifter includes a first branch including a first pull-up transistor configured to pull up a first node, and a first pull-down transistor configured to pull down the first node. The level shifter also includes a second branch including a second pull-up transistor configured to pull up a second node, and a second pull-down transistor configured to pull down the second node. The level shifter further includes a third branch including a third pull-up transistor configured to pull up a third node, and a third pull-down transistor configured to pull down the third node. The first branch is cross coupled with the third branch, the second branch is cross coupled with the third branch, the first pull-down transistor has a first channel width, the second pull-down transistor has a second channel width, and the first channel width is greater than the second channel width.

A second aspect relates to a method for level shifting an input signal using a level shifter. The level shifter includes a first branch, a second branch, and a third branch, wherein the first branch is cross coupled with the third branch, and the second branch is cross coupled with the third branch. The method includes routing the input signal to the first branch and the second branch, wherein the first branch and the second branch are asymmetrical. The method also includes routing a complement of the input signal to the third branch, and providing an output signal from a node of the second branch.

BRIEF DESCRIPTION OF THE DRAWINGS

FIG. 7A shows exemplary simulation results for two voltage level shifters across a wide range of operating conditions according to certain aspects of the present disclosure.

FIG. 7B is a table showing exemplary upshift conditions for the simulation results in FIG. 7A according to certain aspects of the present disclosure.

FIG. 7C is a table showing exemplary downshift conditions for the simulation results in FIG. 7A according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
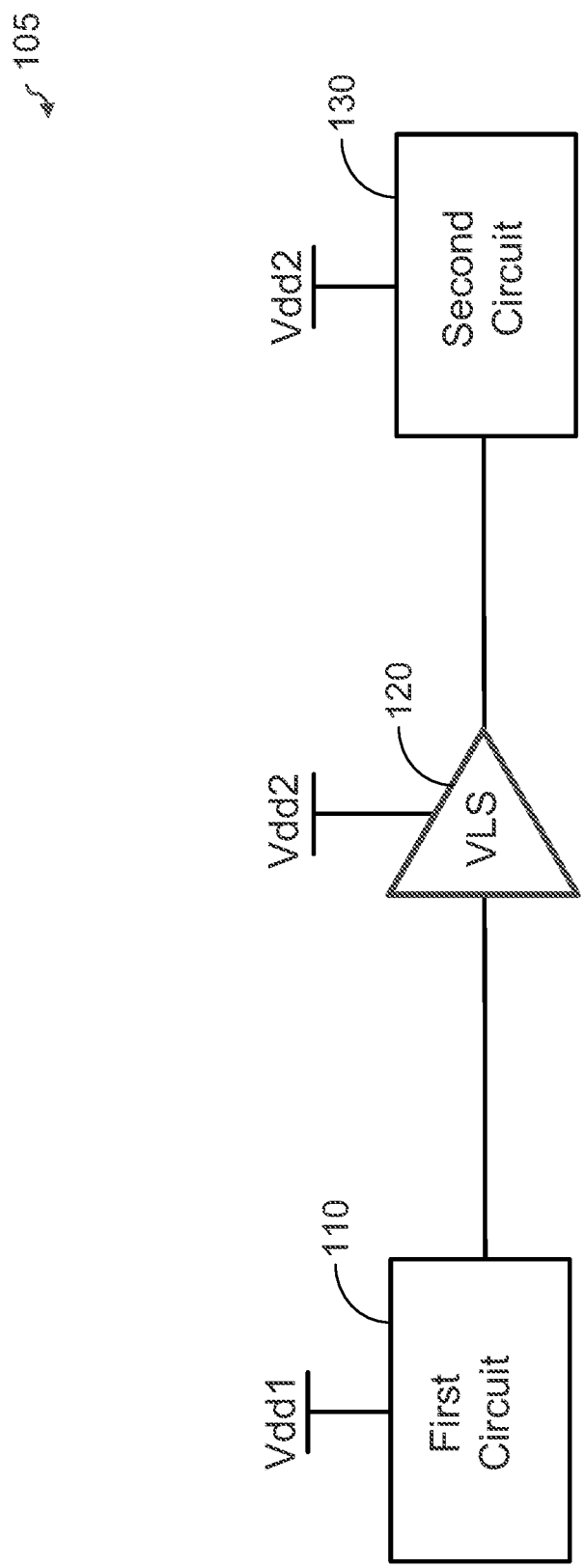
FIG. 1 shows an example of a system including a voltage level shifter.

FIG. 1 shows an example of a system 105 (e.g., a system on a chip (SoC)) with multiple voltage domains according to aspects of the present disclosure. The system 105 includes a first circuit 110 in a first voltage domain and a second circuit 130 in a second voltage domain. The first voltage domain has a first supply voltage Vdd1 and the second voltage domain has a second supply voltage Vdd2, which may be higher than the first supply voltage Vdd1. For the example in which Vdd2 is higher than Vdd1, the first circuit 110 may operate at a lower voltage for reduced power consumption and the second circuit 130 may operate at a higher voltage for increased performance and/or to drive a signal off chip.

The first supply voltage Vdd1 and the second supply voltage Vdd2 may be generated by a power management integrated circuit (PMIC), in which the first supply voltage Vdd1 and the second supply voltage Vdd2 are distributed from the PMIC (not shown) to the first circuit 110 and the second circuit 130, respectively, via a power distribution network (not shown). In certain aspects, the PMIC may be configured to dynamically scale the first supply voltage Vdd1 and/or the second supply voltage Vdd2 (e.g., based on a performance mode of the system 105).

The system 105 also includes a voltage level shifter 120 to facilitate communication between the first circuit 110 and the second circuit 130. The voltage level shifter 120 is configured to shift the voltage level of an input signal from the first circuit 110 in the first voltage domain to generate a corresponding output signal in the second voltage domain and output the output signal to the second circuit 130. The input signal may be a data signal, a clock signal, or another type of signal. The voltage level shifter 120 may be non-inverting or inverting (i.e., inverts the input signal in addition to shifting the voltage level of the input signal).

For the example where Vdd2 is higher than Vdd1, the voltage level shifter 120 is configured to shift the voltage level of the input signal up. In this example, the voltage level shifter 120 may be referred to as a voltage level-up shifter. The input signal from the first circuit 110 may swing between approximately Vdd1 and ground, and the output signal of the voltage level shifter 120 may swing between approximately Vdd2 and ground. As shown in FIG. 1, the voltage level shifter 120 may be powered by the second supply voltage Vdd2 to generate an output signal that swings between approximately Vdd2 and ground.

Figure 2:
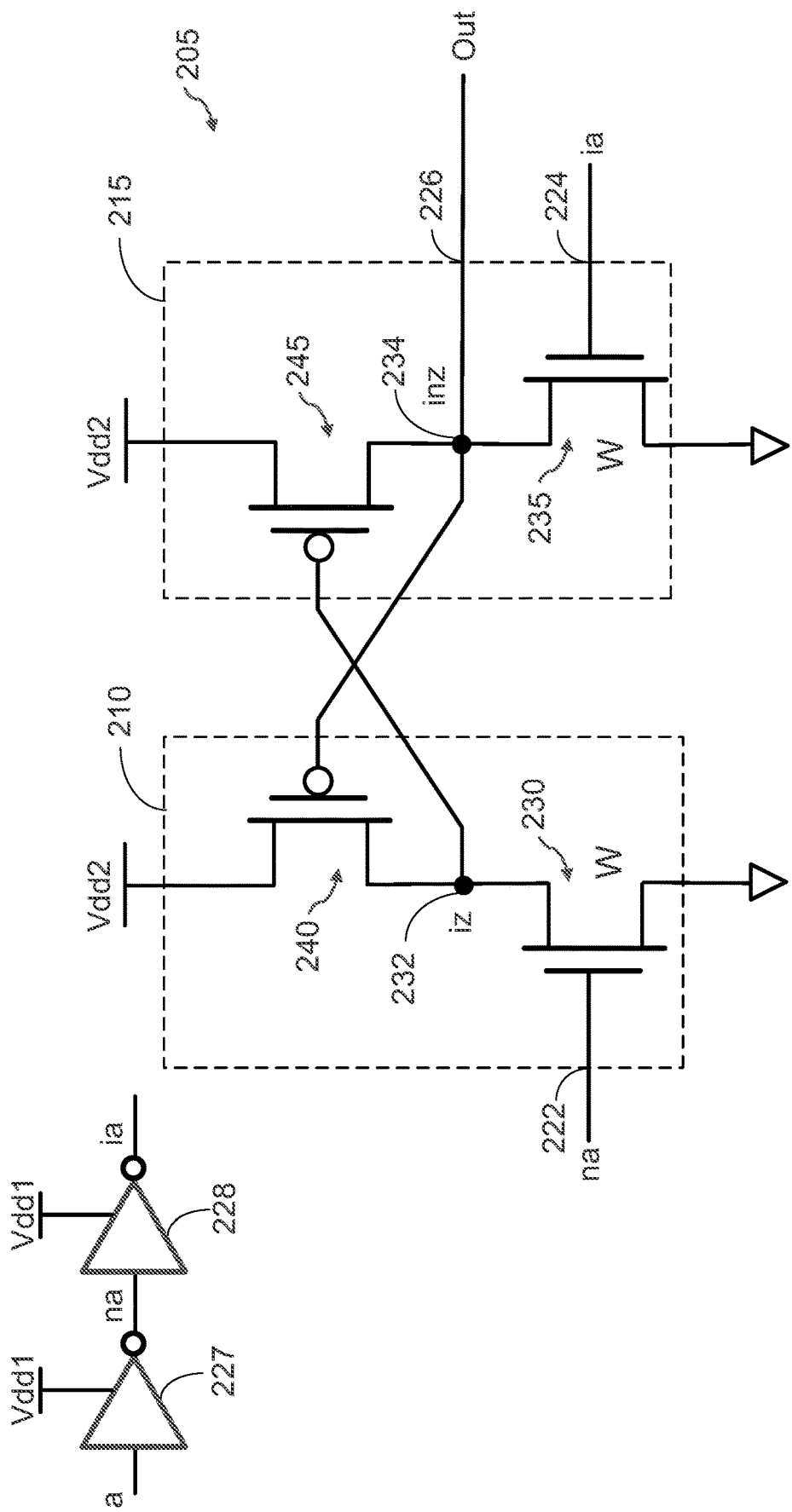
FIG. 2 shows an example of a voltage level shifter according to certain aspects of the present disclosure.

FIG. 2 shows an example of a voltage level shifter 205 according to certain aspects. The voltage level shifter 205 may be used to implement the voltage level shifter 120 in FIG. 1. The voltage level shifter 205 is configured to shift the voltage level of an input signal in the first voltage domain to generate a corresponding output signal in the second voltage domain.

The voltage level shifter 205 includes a first branch 210 and a second branch 215, where each branch is coupled between the second supply voltage Vdd2 and ground. The first branch 210 is cross coupled with the second branch 215. A first input 222 of the level shifter 205 is coupled to the first branch 210 and is driven by the input signal (labeled "na" in FIG. 2). A second input 224 of the level shifter 205 is coupled to the second branch 215 and is driven by the complement (i.e., inverse) of the input signal (labeled "ia" in FIG. 2). The input signal na and its complement ia are in the first voltage domain and may each have a voltage swing of approximately Vdd1.

In one example, the input signal na and the complement input signal ia are generated from an input signal (labeled "a") using a first inverter 227 and a second inverter 228 coupled in series. In this example, the inverters 227 and 228 may be used to reduce the impact of input slew variation. The inverters 227 and 228 are powered by the first supply voltage Vdd1, and the input of the first inverter 227 may be coupled to the first circuit 110 to receive the input signal a. For ease of illustration, the individual connections between the inverters 227 and 228 and the first and second branches 210 and 215 are not explicitly shown in FIG. 2.

In the example in FIG. 2, the first branch 210 includes a first pull-down transistor 230 and a first pull-up transistor 240, where the first pull-down transistor 230 is configured to pull down a first node 232 (labeled "iz") and the first pull-up transistor 240 is configured to pull up the first node 232. The first pull-down transistor 230 is coupled between the first node 232 and ground, and the first pull-up transistor 240 is coupled between the second supply voltage Vdd2 and the first node 232. In this example, the first pull-down transistor 230 is implemented with an n-type field effect transistor (NFET) and the first pull-up transistor 240 is implemented with a p-type field effect transistor (PFET).

The second branch 215 includes a second pull-down transistor 235 and a second pull-up transistor 245, where the second pull-down transistor 235 is configured to pull down a second node 234 (labeled "inz") and the second pull-up transistor 245 is configured to pull up the second node 234. The second pull-down transistor 235 is coupled between the second node 234 and ground, and the second pull-up transistor 245 is coupled between the second supply voltage Vdd2 and the second node 234. In this example, the second pull-down transistor 235 is implemented with an NFET and the second pull-up transistor 245 is implemented with PFET.

The gate of the first pull-down transistor 230 is coupled to the first input 222 and hence driven by the input signal na. The gate of the second pull-down transistor 235 is coupled to the second input 224 and hence driven by the complement of the input signal ia. The gate of the first pull-up transistor 240 is coupled to the second node 234 and the gate of the second pull-up transistor 245 is coupled to the first node 232, which provide the cross coupling between the first branch 210 and the second branch 215. In this example, the output 226 of the level shifter 205 is coupled to the second node 234.

Operation of the level shifter 205 will now be discussed for the case where the input signal na transitions from low to high. In this case, the first pull-down transistor 230 turns on and the second pull-down transistor 235 turns off. Since the first pull-down transistor 230 turns on, the first pull-down transistor 230 provides a conduction path from the first node 232 to ground, which pulls down the first node 232. The pulling down of the first node 232 causes the second pull-up transistor 245 to turn on since the gate of the second pull-up transistor 245 is coupled to the first node 232. This causes the second pull-up transistor 245 to provide a conduction path from the second supply voltage Vdd2 to the second node 234, which pulls up the second node 234. The pulling up of the second node 234 causes the first pull-up transistor 240 to turn off since the gate of the first pull-up transistor 240 is coupled to the second node 234. This shuts off the conduction path between the second supply voltage Vdd2 and the first node 232, which helps the first pull-down transistor 230 pull down the first node 232 to approximately ground. In this case, the cross coupling between the first branch 210 and the second branch 215 provides positive feedback that helps pull down the first node 232 to approximately ground and pull up the second node 234 to approximately Vdd2.

Since the output 226 of the level shifter 205 is provided by the second node 234 in this example, the output 226 is driven high. In this example, the input signal has a voltage of approximately Vdd1 since the input signal is in the first voltage domain. The output signal has a voltage of approximately Vdd2. This is because the second node 234 (which is coupled to the output 226) is pulled up to approximately Vdd2. Thus, in this example, the level shifter 205 shifts the voltage level of the input signal from Vdd1 to approximately Vdd2.

For the case where the input signal na transitions from high to low, the first node 232 is pulled up to approximately Vdd2 and the second node 234 is pulled down to approximately ground. In this case, the output 226 of the level shifter 205 is driven low.

Figure 3:
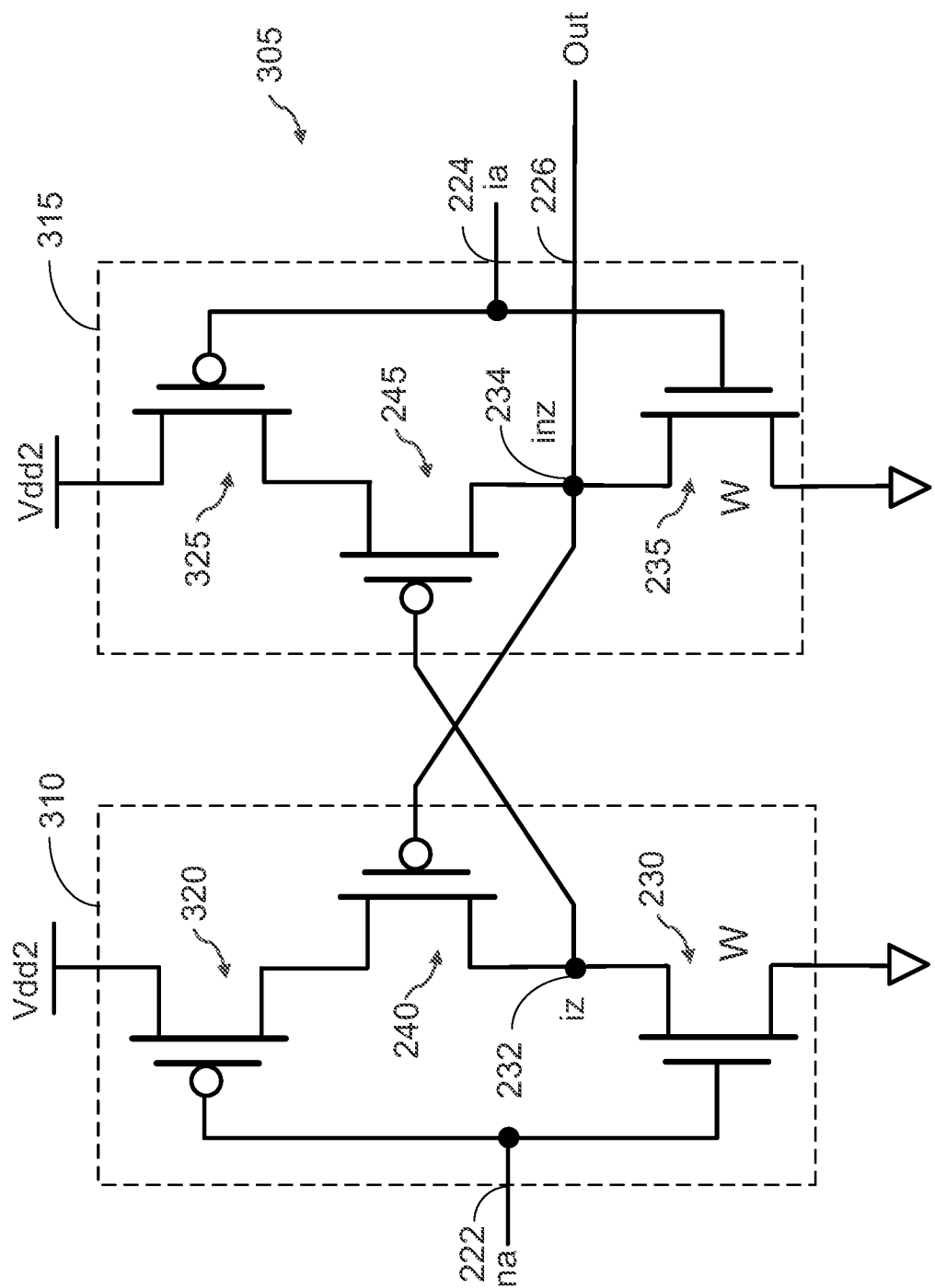
FIG. 3 shows another example of a voltage level shifter according to certain aspects of the present disclosure.

FIG. 3 shows an example of another voltage level shifter 305 according to certain aspects. The voltage level shifter 305 is obtained by adding a third pull-up transistor 320 and a fourth pull-up transistor 325 to the voltage level shifter 205 in FIG. 2. The third pull-up transistor 320 is coupled in series with the first pull-up transistor 240 in the first branch 310, and the fourth pull-up transistor 325 is coupled in series with the second pull-up transistor 245 in the second branch 315. The gate of the third pull-up transistor 320 is coupled to the first input 222 and the gate of the fourth pull-up transistor 325 is coupled to the second input 224.

The third pull-up transistor 320 provides contention mitigation between the first pull-up transistor 240 and the first pull-down transistor 230. For example, when the input signal na transitions from low to high, the first pull-down transistor 230 turns on to pull down the first node 232. In this case, the first pull-up transistor 240 may initially be turned on before the voltage of the second node 234 rises high enough to turn off the first pull-up transistor 240. As a result, the first pull-up transistor 240 may initially fight the pulling down of the first node 232 by the first pull-down transistor 230. To reduce this contention, the third pull-up transistor 320 is at least partially turned off by the input signal na, which reduces the current flow through the first pull-up transistor 240 and hence reduces the ability of the first pull-up transistor 240 to fight the first pull-down transistor 230 (i.e., reduces the current drive capability of the first pull-up transistor 240). The fourth pull-up transistor 325 mitigates contention between the second pull-up transistor 245 and the second pull-down transistor 235 for the case where the input signal na transitions from high to low (i.e., the complement input signal is transitions from low to high) in a similar manner.

For high-speed applications, it is desirable to reduce the fall time of the level shifter 305 so that the level shifter 305 can transition from high to low faster. This may be achieved by making the channel width of the second pull-down transistor 235 in the second branch 315 wider (indicated by an uppercase "W" in FIG. 3). The wider channel width increases the current drive capability of the second pull-down transistor 235, which allows the second pull-down transistor 235 to pull down the output 226 at the second node 234 faster for a faster fall time. The first pull-down transistor 230 also has approximately the same channel width as the second pull-down transistor 235. This is because the first and second branches 310 and 315 are symmetric.

Increasing the channel width of the second pull-down transistor 235 to decrease the fall time, however, increases the rise time of the level shifter 305, which slows down the transition of the level shifter 305 output from low to high. This is because increasing the channel width of the second pull-down transistor 235 increases the capacitive load from the second pull-down transistor 235 on the second node 234. The larger capacitive load on the second node 234 makes it harder for the second pull-up transistor 245 in the second branch 315 to pull up the output 226 (e.g., by increasing the charge needed to pull up the output 226).

The increased rise time due to the larger capacitive load results in a larger difference (i.e., imbalance) between the fall time and the rise time of the level shifter 305. The large imbalance in the fall time and rise time manifests as duty cycle distortion, in which the duty cycle of the output signal differs from the duty cycle of the input signal by a large amount. The large duty cycle distortion may cause flip-flops or other devices in the second voltage domain receiving the output signal to malfunction. For example, the duty cycle distortion may reduce the pulse width of the output signal such that the output signal fails to meet the minimum pulse width requirement of a flip-flop in the second voltage domain.

One approach to reduce duty cycle distortion caused by the level shifter 305 is to couple one or more inverters to the output 226 of the level shifter 305. In this approach, the one or more inverters may be configured with rise/fall time imbalances that undo the duty cycle distortion caused by the level shifter 305. In this disclosure, a "rise/fall time imbalance" refers to an imbalance (i.e. mismatch) between a rise time and a fall time of a circuit (e.g., an inverter, a level shifter, etc.).

Figure 4:
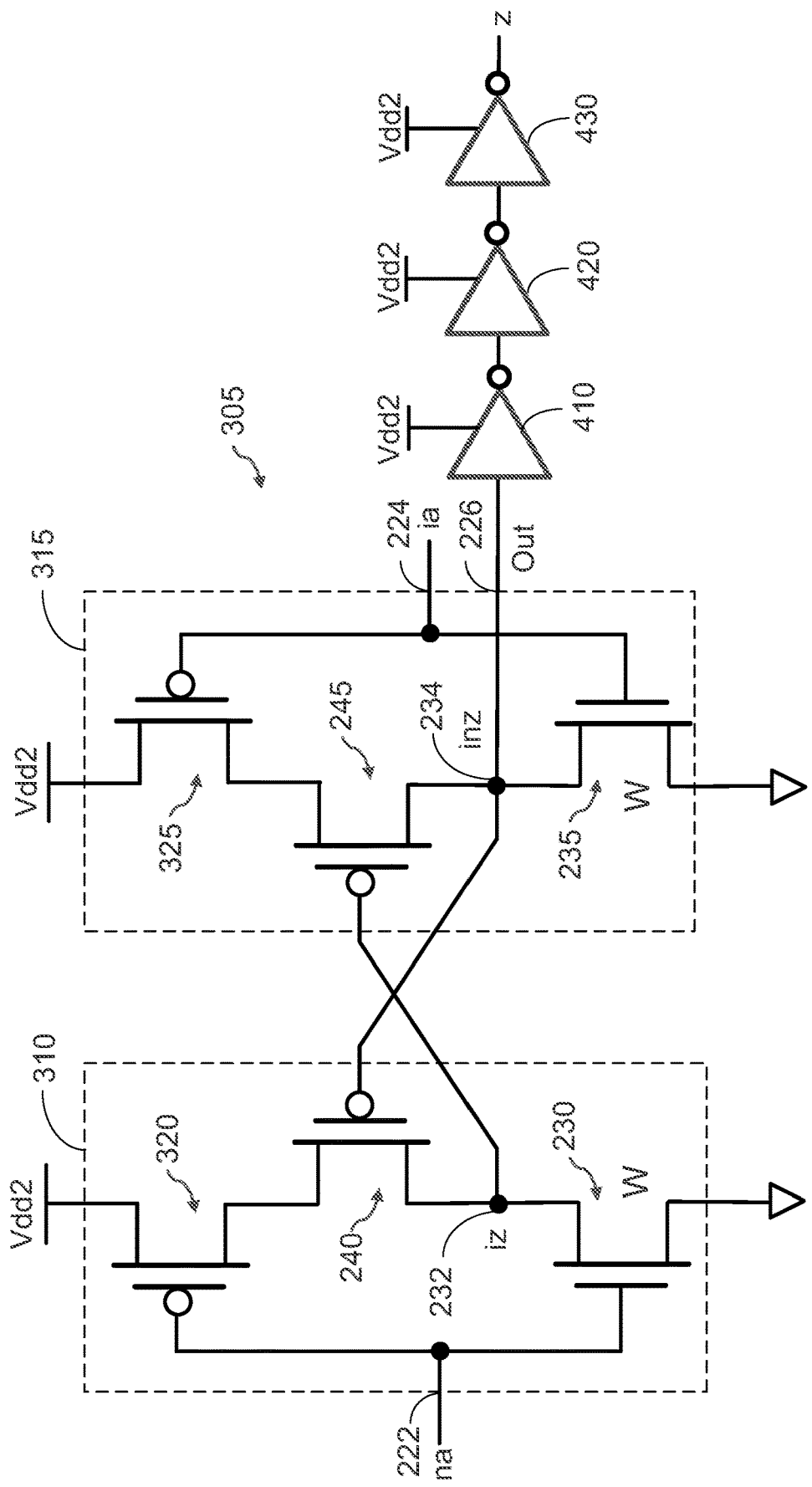
FIG. 4 shows an example of inverters coupled to an output of a voltage level shifter for reducing duty cycle distortion according to certain aspects of the present disclosure.

An example of this approach is illustrated in FIG. 4 which shows a first inverter 410, a second inverter 420 and a third inverter 430 coupled in series to the output 226 of the level shifter 305. In this example, the inverters 410, 420 and 430 may be configured with rise/fall time imbalances that approximately undo the duty cycle distortion caused by the level shifter 305 at a particular process, voltage and temperature (PVT) corner. The rise/fall time imbalance of each inverter at the PVT corner may be configured by sizing the channel width of the pull-down transistor (e.g., NFET) and the channel width of the pull-up transistor (e.g., PFET) in the inverter according to a desired rise/fall time imbalance. In this example, the final level-shifted output signal may be taken at the output labeled ("z") of the third inverter 430. It is to be appreciated that the above approach may also be applied to the exemplary level shifter 205 shown in FIG. 2 to reduce duty cycle distortion.

A challenge with the above approach is that the above approach may not provide enough reduction in duty cycle distortion over a wide range of operating conditions (e.g., a wide voltage range, a wide frequency range, and/or across process corners). This is because the rise/fall time imbalances of the inverters 410, 420 and 430 may be optimized to reduce duty cycle distortion at a particular PVT corner, and may therefore not provide enough reduction in duty cycle distortion at other PVT corners. As a result, the above approach may not be suitable for a level shifter design that needs to cover a wide range of operating conditions. Accordingly, an approach that reduces duty cycle distortion over a wide range of operating conditions is desirable.

Aspects of the present disclosure provide a voltage level shifter that reduces duty cycle distortion over a wide range of operating conditions (e.g., a wide voltage range, a wide frequency range, and/or across process corners). This is achieved by using asymmetric transistor sizes (e.g., asymmetric transistor channel widths) in the level shifter, as discussed further below.

The "channel width" of a transistor may refer to a gate width of the transistor, for example, for a transistor fabricated using a planar process. For a transistor fabricated using a FinFET process, the "channel width" of a transistor may refer to the width and/or the height of fins in the transistor and/or the number of fins in the transistor.

Figure 5:
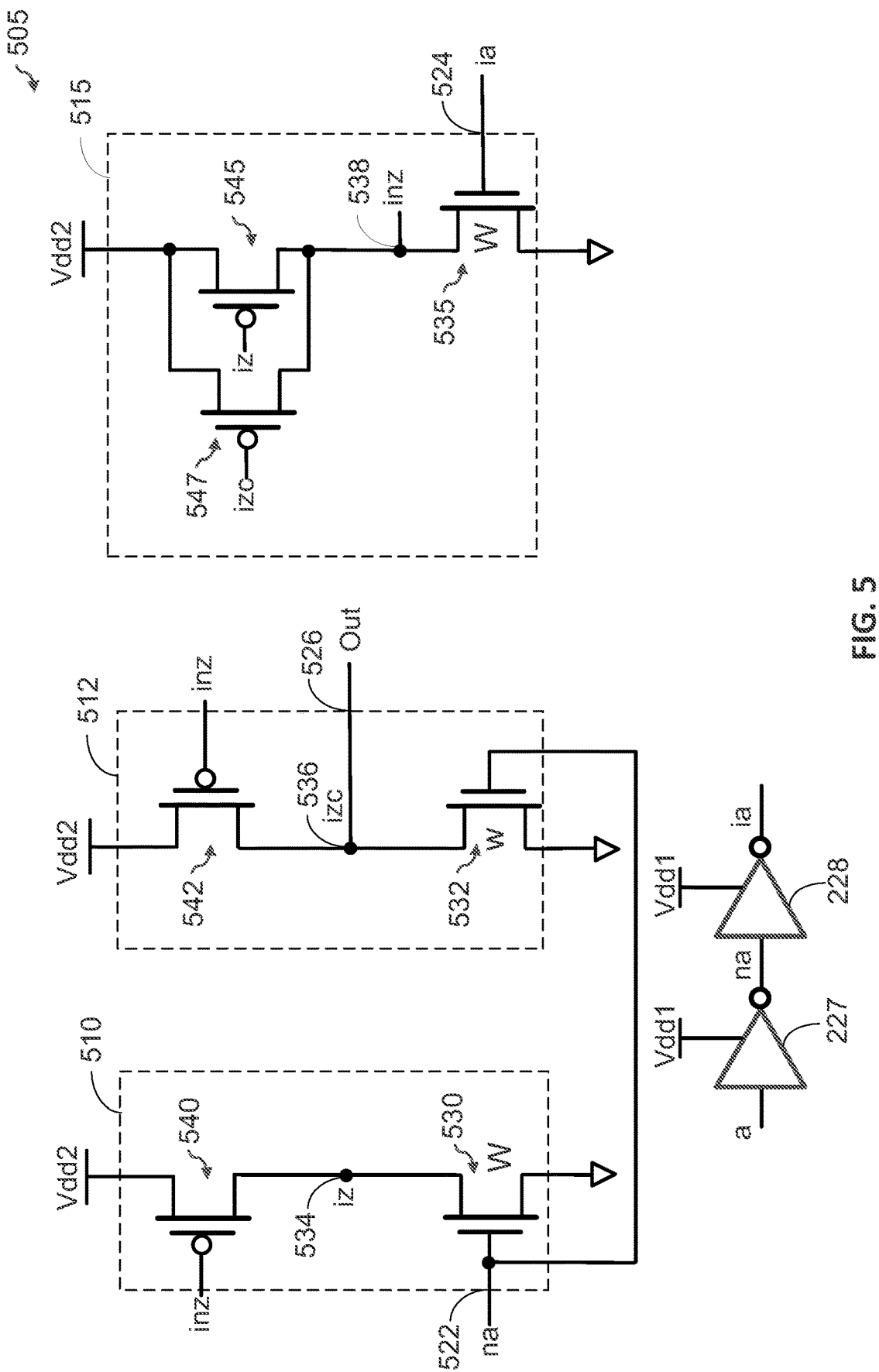
FIG. 5 shows an example of a voltage level shifter with reduced duty cycle distortion according to certain aspects of the present disclosure.

FIG. 5 shows an exemplary voltage level shifter 505 with reduced duty cycle distortion according to certain aspects. The voltage level shifter 505 may be used to implement the voltage level shifter 120 in FIG. 1. The voltage level shifter 505 is configured to shift the voltage level of an input signal in the first voltage domain to generate a corresponding output signal in the second voltage domain. The input signal may be a data signal, a clock signal, or another type of signal.

The voltage level shifter 505 includes a first branch 510, a second branch 512, and a third branch 515, where each branch is coupled between the second supply voltage Vdd2 and ground. The first branch 510 is cross coupled with the third branch 515, and the second branch 512 is cross coupled with the third branch 515, as discussed further below.

A first input 522 of the level shifter 505 is coupled to the first branch 510 and the second branch 512. The first input 522 is driven by the input signal na, which is in the first voltage domain.

A second input 524 of the level shifter 505 is coupled to the third branch 515 and is driven by the complement (i.e., inverse) of the input signal ia. The input signal na and the complement of the input signal ia may be generated by the inverters 227 and 228. For the example in which the level shifter 505 implements the level shifter 120 in FIG. 1, the input of the first inverter 227 may be coupled to the output of the first circuit 110 in the first voltage domain to receive the input signal a from the first circuit 110. The input signal na and its complement ia are in the first voltage domain and may each have a voltage swing of approximately Vdd1.

In the example in FIG. 5, the first branch 510 includes a first pull-down transistor 530 and a first pull-up transistor 540, where the first pull-down transistor 530 is configured to pull down a first node 534 (labeled "iz") and the first pull-up transistor 540 is configured to pull up the first node 534. The first pull-down transistor 530 is coupled between the first node 534 and ground, and the first pull-up transistor 540 is coupled between the second supply voltage Vdd2 and the first node 534. The gate of the first pull-down transistor 530 is coupled to the first input 522 and therefore driven by the input signal na.

In the example in FIG. 5, the first pull-down transistor 530 is implemented with an n-type field effect transistor (NFET) and the first pull-up transistor 540 is implemented with a p-type field effect transistor (PFET). However, it is to be appreciated that the first pull-down transistor 530 and the first pull-up transistor 540 may be implemented with other types of transistors.

The second branch 512 includes a second pull-down transistor 532 and a second pull-up transistor 542, where the second pull-down transistor 532 is configured to pull down a second node 536 (labeled "izc") and the second pull-up transistor 542 is configured to pull up the second node 536. The second pull-down transistor 532 is coupled between the second node 536 and ground, and the second pull-up transistor 542 is coupled between the second supply voltage Vdd2 and the second node 536. The gate of the second pull-down transistor 532 is coupled to the first input 522 and therefore driven by the input signal na. In the example in FIG. 5, the output 526 of the level shifter 505 is coupled to the second node 536. For the example in which the level shifter 505 implements the level shifter 120 in FIG. 1, the output 526 may be coupled to the second circuit 130 in the second voltage domain.

In the example in FIG. 5, the second pull-down transistor 532 is implemented with an NFET and the second pull-up transistor 542 is implemented with PFET. However, it is to be appreciated that the second pull-down transistor 532 and the second pull-up transistor 542 may be implemented with other types of transistors.

The first branch 510 and the second branch 512 are asymmetrical in that the second pull-down transistor 532 in the second branch 512 has a smaller channel width (indicated by a lowercase "w" in FIG. 5) compared with the first pull-down transistor 530 in the first branch 510, which has a wider channel width (indicated by an uppercase "W"). In one example, the channel width of the first pull-down transistor 530 is at least 50 percent greater than the channel width of the second pull-down transistor 532. As discussed further below, the asymmetric transistor sizes between the first branch 510 and the second branch 512 reduces the difference between the rise time and the fall time of the level shifter 505 over a wide range of conditions, and therefore reduces duty cycle distortion over a wide range of conditions.

In the example in FIG. 5, the third branch 515 includes a third pull-down transistor 535, a third pull-up transistor 545, and a fourth pull-up transistor 547. The third pull-down transistor 535 is configured to pull down a third node 538 (labeled "inz"). The third pull-down transistor 535 is coupled between the third node 538 and ground. The gate of the third pull-down transistor 535 is coupled to the second input 524 and therefore driven by the complement of the input signal ia. In the example in FIG. 5, the third pull-down transistor 535 has approximately the same channel width as the first pull-down transistor 530 (indicated by the uppercase "W"). In one example, the channel width of the third pull-down transistor 535 is at least 50 percent greater than the channel width of the second pull-down transistor 532. The third pull-up transistor 545 and the fourth pull-up transistor 547 are each configured to pull up the third node 538. The third pull-up transistor 545 and the fourth pull-up transistor 547 are coupled in parallel between the second supply voltage Vdd2 and the third node 538.

In the example in FIG. 5, the third pull-down transistor 535 is implemented with an NFET and each of the third pull-up transistor 545 and the fourth pull-up transistor 547 is implemented with a PFET. However, it is to be appreciated that the third pull-down transistor 535, the third pull-up transistor 545 and the fourth pull-up transistor 547 may be implemented with other types of transistors.

The gate of the first pull-up transistor 540 is coupled to the third node 538 and the gate of the third pull-up transistor 545 is coupled to the first node 534, which provide the cross coupling between the first branch 510 and the third branch 515. For ease of illustration, the connections between the first branch 510 and the third branch 515 are not explicitly shown in FIG. 5. The gate of the second pull-up transistor 542 is coupled to the third node 538 and the gate of the fourth pull-up transistor 547 is coupled to the second node 536, which provide the cross coupling between the second branch 512 and the third branch 515. For ease of illustration, the connections between the second branch 512 and the third branch 515 are not explicitly shown in FIG. 5.

Operation of the level shifter 505 will now be discussed for the case where the input signal na transitions from high to low. In this case, the first pull-down transistor 530 and the second pull-down transistor 532 turn off. Also, the third pull-down transistor 535 turns on, causing the third pull-down transistor 535 to provide a conduction path from the third node 538 to ground, which pulls down the third node 538. The pulling down of the third node 538 causes the first pull-up transistor 540 to turn on since the gate of the first pull-up transistor 540 is coupled to the third node 538 and causes the second pull-up transistor 542 to turn on since the gate of the second pull-up transistor 542 is also coupled to the third node 538. As a result, the first pull-up transistor 540 pulls up the first node 534, and the second pull-up transistor 542 pulls up the second node 536. The pulling up of the first node 534 causes the third pull-up transistor 545 to turn off since the gate of the third pull-up transistor 545 is coupled to the first node 534, and the pulling up of the second node 536 causes the fourth pull-up transistor 547 to turn off since the gate of the fourth pull-up transistor 547 is coupled to the second node 536. The turning off of the third pull-up transistor 545 and the fourth pull-up transistor 547 shuts off the conduction path between the second supply voltage Vdd2 and the third node 538, which helps the third pull-down transistor 535 pull down the third node 538.

In this case, the output 526 of the level shifter 505 rises. This is because the second node 536 (which is coupled to the output 526) rises. Thus, the rise time of the level shifter 505 depends on the rise time of the second node 536 in this example. The smaller channel width of the second pull-down transistor 532 (indicated by the lowercase "w")

reduces the rise time of the second node 536, and hence reduces the rise time of the output 526 compared with the level shifter 205 in FIG. 2. This is because the smaller channel width translates into a smaller capacitive load on the second node 536, which allows the second pull-up transistor 542 to pull up the second node 536 (and hence the output 526) faster. The reduced rise time reduces the difference between the rise time and the fall time, thereby reducing the imbalance between the rise time and fall time of the level shifter 505.

The cross coupling of each of the first branch 510 and the second branch 512 with the third branch 515 and the wider channel width of the first pull-down transistor 530 allow the level shifter 505 to achieve a relatively fast fall time when the input signal na transitions from low to high even with the smaller channel width of the second pull-down transistor 532, as explained further below.

When the input signal na transitions from low to high, the first pull-down transistor 530 and the second pull-down transistor 532 turn on, and the third pull-down transistor 535 turns off. As a result, the first pull-down transistor 530 pulls down the first node 534 and the second pull-down transistor 532 pulls down the second node 536. Since the first pull-down transistor 530 has a wider channel width (indicated by the uppercase "W"), the first pull-down transistor 530 pulls down the first node 534 faster than the second pull-down transistor 532 pulls down the second node 536. The faster pull down of the first node 534 causes the third pull-up transistor 545 to turn on faster since the gate of the third pull-up transistor 545 is coupled to the first node 534. The faster turning on of the third pull-up transistor 545 causes the third node 538 to pull up faster. The faster pulling up of the third node 538 turns off the second pull-up transistor 542 faster since the gate of the second pull-up transistor 542 is coupled to the third node 538. The faster turning off of the second pull-up transistor 542 shuts off the conduction path between the second supply voltage Vdd2 and the second node 536 faster, which helps the second pull-down transistor 532 pull down the second node 536 (and hence the output 526) faster. This allows the level-shifter 505 to achieve a relatively fast fall time even with the smaller channel width at the second pull-down transistor 532.

Thus, the cross coupling of each of the first branch 510 and the second branch 512 with the third branch 515 and the asymmetric channel widths of the first pull-down transistor 530 and the second pull-down transistor 532 allow the level shifter 505 to achieve both a fast rise time and a fast fall time over a wide range of conditions. The fast rise time and fast fall time of the level shifter 505 over the wide range of conditions reduce the rise/fall time imbalance of the level shifter 505 over the wide range of conditions, thereby reducing duty cycle distortion over the wide range of conditions. This is verified by exemplary simulation results, as discussed further below.

Figure 6:
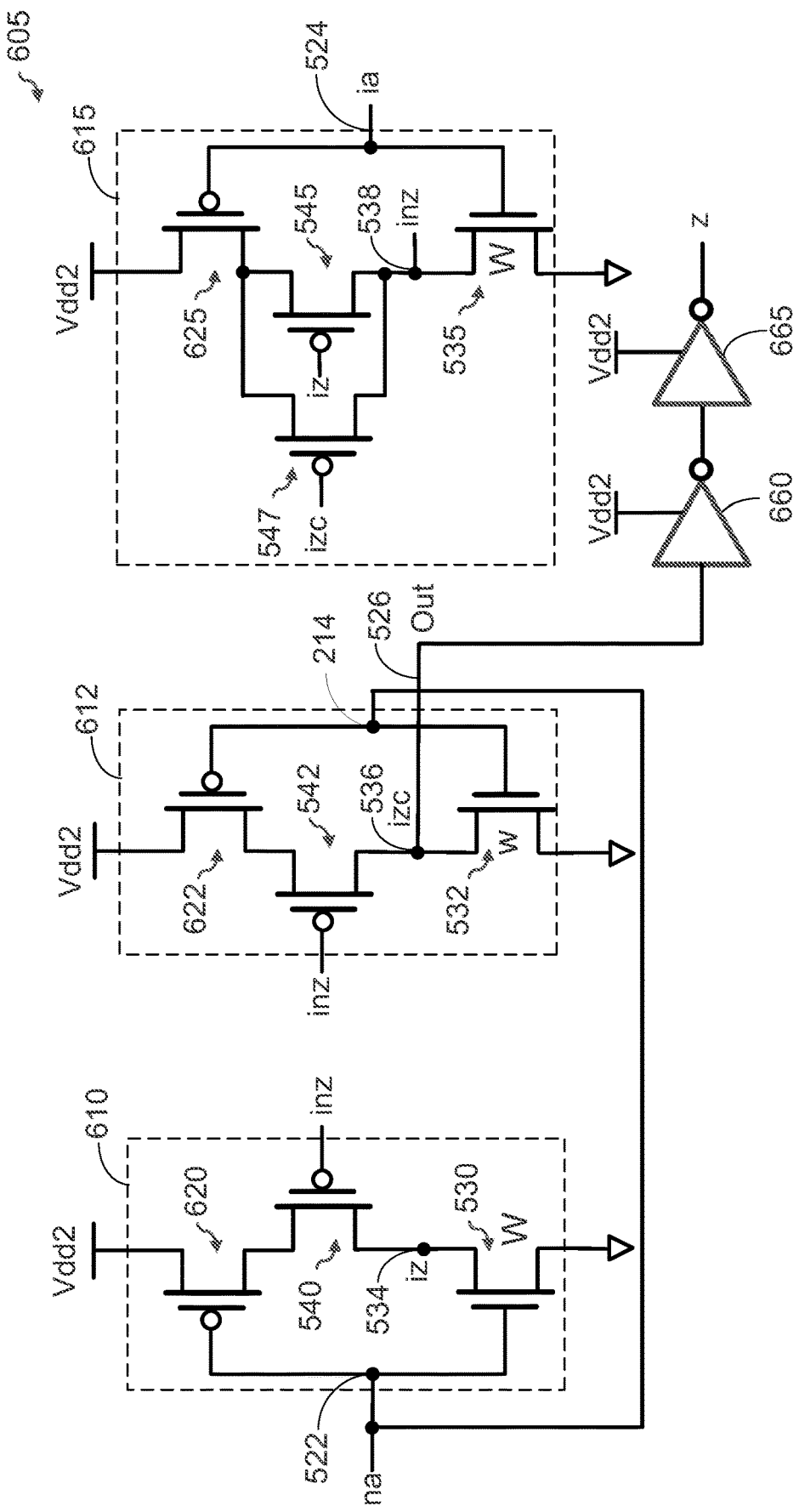
FIG. 6 shows another example of a voltage level shifter with reduced duty cycle distortion according to certain aspects of the present disclosure.

FIG. 6 shows another voltage level shifter 605 according to certain aspects. The voltage level shifter 605 is obtained by adding a fifth pull-up transistor 620, a sixth pull-up transistor 622, and a seventh pull-up transistor 625 to the exemplary voltage level shifter 505 in FIG. 5. The fifth pull-up transistor 620 is coupled in series with the first pull-up transistor 540 in the first branch 610 and the sixth pull-up transistor 622 is coupled in series with the second pull-up transistor 542 in the second branch 612. The gate of the fifth pull-up transistor 620 is coupled to the first input 522 and the gate of the first pull-down transistor 530. The gate of the sixth pull-up transistor 622 is coupled to the first input 522 and the gate of the second pull-down transistor 532.

The seventh pull-up transistor 625 is coupled in series with the third pull-up transistor 545 and in series with the fourth pull-up transistor 547. As discussed above, the third pull-up transistor 545 and the fourth pull-up transistor 547 are coupled in parallel. The gate of the seventh pull-up transistor 625 is coupled to the second input 524 and the gate of the third pull-down transistor 535.

In the example in FIG. 6, each of the fifth pull-up transistor 620, the sixth pull-up transistor 622, and the seventh pull-up transistor 625 is implemented with a PFET. However, it is to be appreciated that each of the fifth pull-up transistor 620, the sixth pull-up transistor 622, and the seventh pull-up transistor 625 may be implemented with another type of transistor.

The fifth pull-up transistor 620 provides contention mitigation between the first pull-up transistor 540 and the first pull-down transistor 530. For example, when the input signal na transitions from low to high, the first pull-down transistor 530 turns on to pull down the first node 534. In this case, the first pull-up transistor 540 may initially be turned on before the voltage of the third node 538 rises high enough to turn off the first pull-up transistor 540. As a result, the first pull-up transistor 540 may initially fight the pulling down of the first node 534 by the first pull-down transistor 530. To reduce this contention, the fifth pull-up transistor 620 is at least partially turned off by the input signal na. Since the fifth pull-up transistor 620 is coupled in series with the first pull-up transistor 540, this reduces the current flow through the first pull-up transistor 540 and hence reduces the ability of the first pull-up transistor 540 to fight the first pull-down transistor 530 (i.e., reduces the current drive capability of the first pull-up transistor 540).

The sixth pull-up transistor 622 mitigates contention between the second pull-up transistor 542 and the second pull-down transistor 532. For example, when the input signal transitions from low to high, the second pull-down transistor 532 turns on to pull down the second node 536. In this case, the second pull-up transistor 542 may initially be turned on before the voltage of the third node 538 rises high enough to turn off the second pull-up transistor 542. As a result, the second pull-up transistor 542 may initially fight the pulling down of the second node 536 by the second pull-down transistor 532. To reduce this contention, the sixth pull-up transistor 622 is at least partially turned off by the input signal na. Since the sixth pull-up transistor 622 is coupled in series with the second pull-up transistor 542, this reduces the current flow through the second pull-up transistor 542 and hence reduces the ability of the second pull-up transistor 542 to fight the second pull-down transistor 532 (i.e., reduces the current drive capability of the second pull-up transistor 542).

The seventh pull-up transistor 625 is configured to mitigate contention between the third pull-down transistor 535 and the parallel combination of the third pull-up transistor 545 and the fourth pull-up transistor 547. For example, when the input signal na transitions from high to low, the third pull-down transistor 535 (which is driven by the complement input signal ia) turns on. In this case, the third pull-up transistor 545 and the fourth pull-up transistor 547 may initially be turned on. As a result, the third pull-up transistor 545 and the fourth pull-up transistor 547 may initially fight the pulling down of the third node 538 by the third pull-down transistor 535. To reduce this contention, the seventh pull-up transistor 625 is at least partially turned off by the complement input signal ia. Since the seventh pull-up transistor 625 is coupled in series with the parallel combination of the third pull-up transistor 545 and the fourth pull-up transistor 547, the current drive capabilities of the third pull-up transistor 545 and the fourth pull-up transistor 547 are reduced, which helps the third pull-down transistor 535 pull down the third node 538.

It is to be appreciated that the level shifter 605 is not limited to the exemplary arrangement of the pull-up transistors shown in FIG. 6. For example, in other implementations, the position of the first pull-up transistor 540 and the position of the fifth pull-up transistor 620 shown in FIG. 6 may be swapped, and the position of the second pull-up transistor 542 and the position of the sixth pull-up transistor 622 shown in FIG. 6 may be swapped. Also, the position of the seventh pull-up transistor 625 and the position of the parallel combination of the third pull-up transistor 545 and the fourth pull-up transistor 547 may be swapped.

In the example in FIG. 6, the output 526 is the inverse of the output 226 in FIG. 4. More particularly, when the input signal na transitions from low to high, the output 526 in FIG. 6 goes low and the output 226 in FIG. 4 goes high, and, when the input signal na transitions from high to low, the output 526 in FIG. 6 goes high and the output 226 in FIG. 4 goes low. In one example, a first inverter 660 and a second inverter 665 are coupled in series to the output 526. In this example, the level-shifted output signal at the output (labeled "z") of the second inverter 562 has the same polarity as the level-shifted output signal at the output (labeled "z") of the third inverter 430 in FIG. 4. This is achieved by coupling a different number of inverters to the output 226 in FIG. 4 and the output 526 in FIG. 6 (e.g., three inverters 410, 420 and 430 to the output 226 in FIG. 4 and two inverters 660 and 665 to the output 526 in FIG. 6).

FIG. 7A shows a table 710 including exemplary computer simulation results for the voltage level shifter 305 in FIG. 4 and the voltage level shifter 605 according to certain aspects of the present disclosure. In the table 710, the voltage level shifter 305 is identified as the first shifter, and the voltage level shifter 605 is identified as the second shifter. The level-shifted output signal for each level shifter is taken at output z. As discussed further below, the exemplary results in FIG. 7A show that the voltage level shifter 605 according to aspects of the present disclosure reduces duty cycle distortion (DCD) compared with the voltage level shifter 305 in FIG. 4 over a wide range of operating conditions.

The table 710 shows a minimum duty cycle distortion and a maximum duty cycle distortion for each voltage level shifter across a range of upshift conditions and a range of downshift conditions. In table 710, a negative duty cycle distortion indicates an output duty cycle that is less than the input duty cycle, and a positive duty cycle distortion indicates an output duty cycle that is greater than the input duty cycle.

FIG. 7B shows a table 715 indicating the upshift conditions that were simulated to generate the table 710 in FIG. 7A. For each upshift condition, the table 715 shows the corresponding process corner, first voltage Vdd1, second voltage Vdd2, and frequency. For each process corner, the first letter indicates the NFET corner, the second letter indicates the PFET corner, "f" indicates a fast corner, "s" indicates a slow corner, "t" indicates a typical corner, and "g" indicates that the process corner applies globally in a chip. For each upshift condition in table 715, the voltage of the input signal is shifted up or unshifted.

FIG. 7C shows a table 720 indicating the downshift conditions that were simulated to generate the table 710 in FIG. 7A. For each downshift condition, the table 720 shows the corresponding process corner, first voltage Vdd1, second voltage Vdd2, and frequency. Also, for each down shift condition in table 720, the voltage of the input signal is shifted down or unshifted.

In the example in FIG. 7A, the duty cycle distortion ranges from −3.4% to 4.7% for the voltage level shifter 605 and the duty cycle distortion ranges from −10.7% to 5.5% for the voltage level shifter 305 across all of the simulated upshift conditions and downshift conditions. Thus, the range of duty cycle distortion for the voltage level shifter 605 is substantially smaller than the range of duty cycle distortion for the voltage level shifter 305 across the simulated conditions. The simulation results show that the voltage level shifter 605 reduces duty cycle distortion across a wide range of operating conditions, and therefore may be used for voltage level shifting in applications covering a wide range of operating conditions.

FIG. 7A also shows 3-sigma duty cycle distortion (DCD) for the voltage level shifter 605 and 3-sigma DCD for the voltage level shifter 305 across the simulated conditions. In this example, the 3-sigma DCD is used to account for local process variation within a chip, in which the local process variation is statistically modeled with a standard deviation of three. As shown in FIG. 7A, the 3-sigma DCD is significantly smaller for the voltage level shifter 605 than the voltage level shifter 305 across the simulated conditions.

Figure 8:
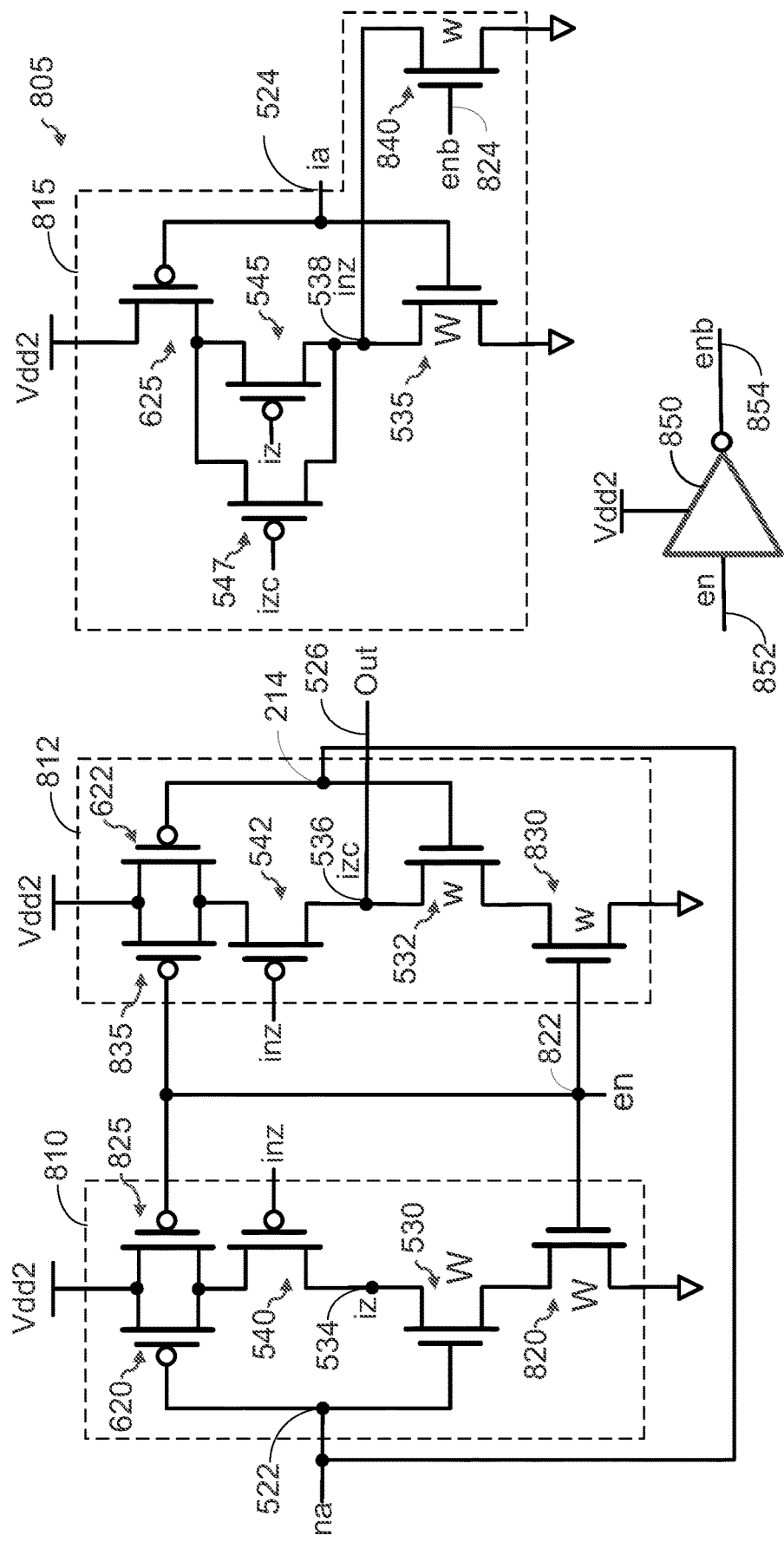
FIG. 8 shows an example of a voltage level shifter including transistors for selectively enabling the voltage level shifter according to certain aspects of the present disclosure.

FIG. 8 shows an example of a voltage level shifter 805 that can be selectively enabled or disabled according to certain aspects. The voltage level shifter 805 is obtained by adding enable transistors to the voltage level shifter 605 in FIG. 6 to enable the level shifter 805 to be selectively enabled and disabled. The enable transistors include a first enable transistor 820, a second enable transistor 825, a third enable transistor 830, a fourth enable transistor 835, and a fifth enable transistor 840. In the first branch 810, the first enable transistor 820 is coupled in series with the first pull-down transistor 530, and the second enable transistor 825 is coupled in parallel with the fifth pull-up transistor 620. In the second branch 812, the third enable transistor 830 is coupled in series with the second pull-down transistor 532, and the fourth enable transistor 835 is coupled in parallel with the sixth pull-up transistor 622. In the third branch 815, the fifth enable transistor 840 is coupled between the third node 538 and ground. In the example in FIG. 8, the first enable transistor 820, the third enable transistor 830, and the fifth enable transistor 840 are each implemented with an NFET, and the second enable transistor 825 and the fourth enable transistor 835 are each implemented with a PFET.

In the example in FIG. 8, the first enable transistor 820 has a channel width approximately equal to the channel width of the first pull-down transistor 530 (indicated by the uppercase "W"). The third enable transistor 830 and the fifth enable transistor 840 each has a channel width approximately equal to the channel width of the second pull-down transistor 532 (indicated by the lowercase "w").

The gates of the first enable transistor 820, the second enable transistor 825, the third enable transistor 830, and the fourth enable transistor 835 are coupled to a first enable input 822. The gate of the fifth enable transistor 840 is coupled to a second enable input 824. In the example in FIG. 8, an enable signal (labeled "en") is input to the first enable input 822 and the complement of the enable signal (labeled "enb") is input to the second enable input 824. The complement of the enable signal may be generated using an inverter 850 coupled between the first enable input 822 and the second enable input 824, in which the input 852 of the inverter 850 is coupled to the first enable input 822 and the output 854 of the inverter 850 is coupled to the second enable input 824. The enable signal and its complement may be in the second voltage domain and may each have a voltage swing of approximately Vdd2.

In the example in FIG. 8, the level shifter 805 is enabled when the enable signal is high. The high enable signal turns on the first enable transistor 820 and the third enable transistor 830, and turns off the second enable transistor 825, the fourth enable transistor 835, and the fifth enable transistor 840. In this case, the level shifter 805 is equivalent to the level shifter 605 in FIG. 6 and enabled.

The level shifter 805 is disabled when the enable signal is low. The low enable signal turns off the first enable transistor 820 and the third enable transistor 830, and turns on the second enable transistor 825, the fourth enable transistor 835, and the fifth enable transistor 840. In this case, the first enable transistor 820 and the third enable transistor 830 decouple the first pull-down transistor 530 and the second pull-down transistor 532, respectively, from ground. Also, the fifth enable transistor 840 pulls down the third node 538 to ground, which turns on the first pull-up transistor 540 and the second pull-up transistor 542. The first pull-up transistor 540 and the second enable transistor 825 pull up the first node 534 to Vdd2, which turns off the third pull-up transistor 545. The second pull-up transistor 542 an the fourth enable transistor 835 pull up the second node 536 to Vdd2, which turns off the fourth pull-up transistor 547. In this example, the output 526 of the level shifter 805 is held high when the level shifter 805 is disabled.

Figure 9:
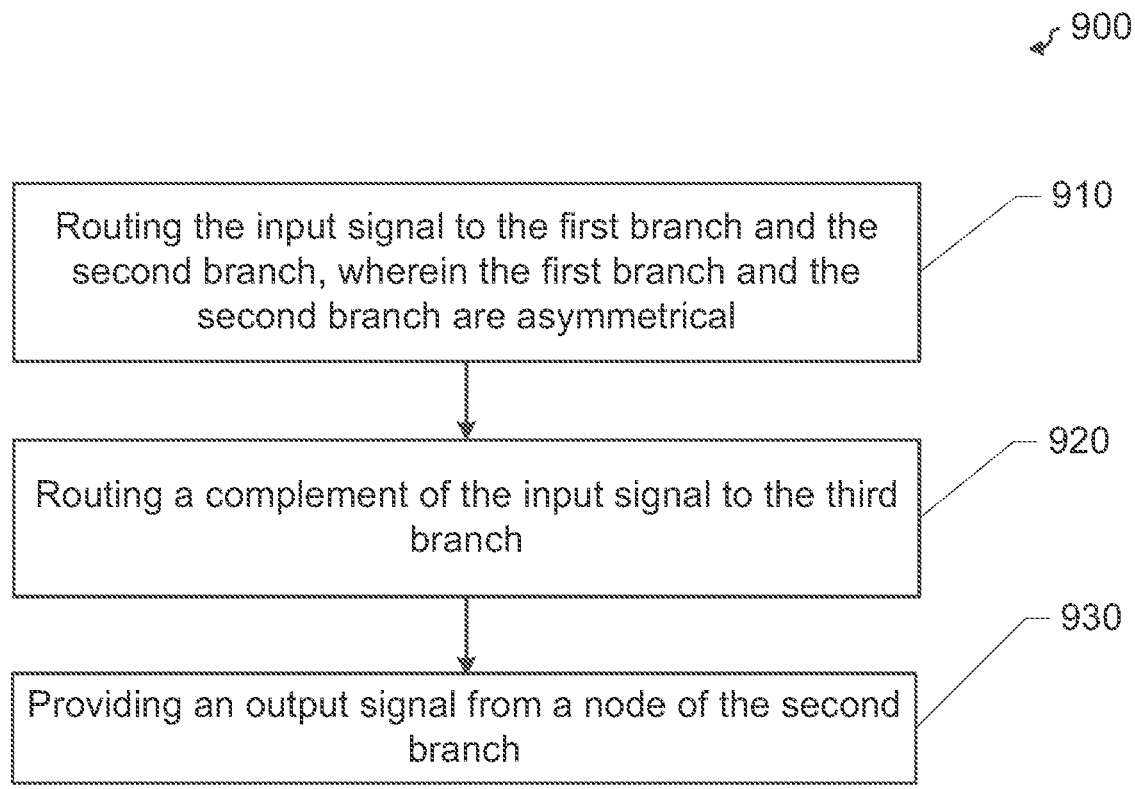
FIG. 9 is a flowchart illustrating a method for voltage level shifting according to certain aspects of the present disclosure.

FIG. 9 is a flowchart illustrating a method 900 of level shifting an input signal using a level shifter according to certain aspects. The level shifter (e.g., level shifter 505, 605 or 805) includes a first branch (e.g., first branch 510, 610 or 810), a second branch (e.g., second branch 512, 612 or 812), and a third branch (e.g., third branch 515, 615 or 815).

At block 910, an input signal is routed to the first branch and the second branch, wherein the first branch and the second branch are asymmetrical. For example, the input signal may be routed to the first branch and the second branch via a first input (e.g., first input 522). The input signal may be provided by the first circuit 110 in the first voltage domain and may have a voltage swing of approximately Vdd1. In certain aspects, the first branch and the second branch may be asymmetrical in that the channel width of a first pull-down transistor (e.g., first pull-down transistor 530) in the first branch is greater (i.e., wider) than the channel width of a second pull-down transistor (e.g., second pull-down transistor 532) in the second branch.

At block 920, a complement of the input signal is routed to the third branch. For example, the complement of the input signal may be routed to the third branch via a second input (e.g., second input 524). The complement of the input signal may be generated by inverting the input signal using an inverter (e.g., inverter 228) in the first voltage domain.

At block 930, an output signal is provided from a node of the second branch. For example, the node may correspond to the second node 536. The output signal is in the second voltage domain and may have a voltage swing of approximately Vdd2. The output signal may be output to the second circuit 130 in the second voltage domain.

It is to be appreciated that the present disclosure is not limited to the exemplary terminology used above to describe aspects of the present disclosure. For example, a branch may also be referred to as a path, an arm, a stage, or another term. In another example, a rise time may also be referred to as a rise delay, and a fall time may also be referred to as a fall delay. In another example, voltage domain may also be referred to as a power domain, or another term.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property and/or within typical manufacturing and design tolerances.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

In the following, further implementations of the present disclosure are described.

Implementation 1. A level shifter, comprising:
a first branch, comprising:
a first pull-up transistor configured to pull up a first node; and
a first pull-down transistor configured to pull down the first node;
a second branch, comprising:
a second pull-up transistor configured to pull up a second node; and
a second pull-down transistor configured to pull down the second node; and
a third branch, comprising:
a third pull-up transistor configured to pull up a third node; and
a third pull-down transistor configured to pull down the third node;
wherein the first branch is cross coupled with the third branch, the second branch is cross coupled with the third branch, the first pull-down transistor has a first channel width, the second pull-down transistor has a second channel width, and the first channel width is greater than the second channel width.

Implementation 2. The level shifter of implementation 1, wherein the first pull-down transistor comprises a first n-type field effect transistor (NFET) and the second pull-down transistor comprises a second NFET.

Implementation 3. The level shifter of implementation 1 or 2, wherein the first pull-up transistor comprises a first p-type field effect transistor (PFET) and the second pull-up transistor comprises a second PFET.

Implementation 4. The level shifter of any of implementations 1 to 3, wherein the third pull-down transistor has a third channel width, and the third channel width is greater than the second channel width.

Implementation 5. The level shifter of any of implementations 1 to 4, further comprising:
  a first input coupled to a gate of the first pull-down transistor and a gate of the second pull-down transistor; and
  a second input coupled to a gate of the third pull-down transistor.

Implementation 6. The level shifter of implementation 5, further comprising an output coupled to the second node.

Implementation 7. The level shifter of implementation 5 or 6, further comprising an inverter coupled between the first input and the second input.

Implementation 8. The level shifter of any of implementations 1 to 7, wherein the first channel width is at least 50 percent greater than the second channel width.

Implementation 9. The level shifter of any of implementations 1 to 8, wherein:
  the third branch further comprises a fourth pull-up transistor configured to pull up the third node;
  a gate of the third pull-up transistor is coupled to the first node; and
  a gate of the fourth pull-up transistor is coupled to the second node.

Implementation 10. The level shifter of implementation 9, wherein the third pull-up transistor and the fourth pull-up transistor are coupled in parallel.

Implementation 11. The level shifter of implementation 9 or 10, wherein:
  a gate of the first pull-up transistor is coupled to the third node; and
  a gate of the second pull-up transistor is coupled to the third node.

Implementation 12. The level shifter of implementation 11, further comprising:
  a first input coupled to a gate of the first pull-down transistor and a gate of the second pull-down transistor; and
  a second input coupled to a gate of the third pull-down transistor.

Implementation 13. The level shifter of implementation 12, further comprising an output coupled to the second node.

Implementation 14. The level shifter of implementation 11, wherein the first channel width is at least 50 percent greater than the second channel width.

Implementation 15. The level shifter of any of implementations 1 to 8, wherein:
  the first branch further comprises a fourth pull-up transistor coupled in series with the first pull-up transistor;
  the second branch further comprises a fifth pull-up transistor coupled in series with the second pull-up transistor;
  a gate of the fourth pull-up transistor is coupled to a gate of the first pull-down transistor; and
  a gate of the fifth pull-up transistor is coupled to a gate of the second pull-down transistor.

Implementation 16. The level shifter of any of implementations 9 to 14, wherein:
  the first branch further comprises a fifth pull-up transistor coupled in series with the first pull-up transistor;
  the second branch further comprises a sixth pull-up transistor coupled in series with the second pull-up transistor;
  a gate of the fifth pull-up transistor is coupled to a gate of the first pull-down transistor; and
  a gate of the sixth pull-up transistor is coupled to a gate of the second pull-down transistor.

Implementation 17. A method for level shifting an input signal using a level shifter, the level shifter including a first branch, a second branch, and a third branch, wherein the first branch is cross coupled with the third branch, and the second branch is cross coupled with the third branch, the method comprising:
  routing the input signal to the first branch and the second branch, wherein the first branch and the second branch are asymmetrical;
  routing a complement of the input signal to the third branch; and
  providing an output signal from a node of the second branch.

Implementation 18. The method of implementation 17, wherein:
  the first branch includes a first pull-down transistor;
  the second branch includes a second pull-down transistor;
  the third branch includes a third pull-down transistor;
  routing the input signal to the first branch and the second branch comprises routing the input signal to a gate of the first pull-down transistor and a gate of the second pull-down transistor, wherein the first pull-down transistor has a first channel width, the second pull-down transistor has a second channel width, and the first channel width is greater than the second channel width; and
  routing the complement of the input signal to the third branch comprises routing the complement of the input signal to a gate of the third pull-down transistor.

Implementation 19. The method of implementation 18, wherein the first channel width is at least 50 percent greater than the second channel width.

Implementation 20. The method of implementation 18 or 19, wherein the third pull-down transistor has a third channel width, and the third channel width is greater than the second channel width.

What is claimed is:

1. A level shifter, comprising:
  a first branch, comprising:
    a first pull-up transistor configured to pull up a first node; and
    a first pull-down transistor configured to pull down the first node;
  a second branch, comprising:
    a second pull-up transistor configured to pull up a second node; and
    a second pull-down transistor configured to pull down the second node;
  a third branch, comprising:
    a third pull-up transistor configured to pull up a third node; and
    a third pull-down transistor configured to pull down the third node;
  a first input coupled to a gate of the first pull-down transistor and a gate of the second pull-down transistor; and
  a second input coupled to a gate of the third pull-down transistor;
    wherein the first branch is cross coupled with the third branch, the second branch is cross coupled with the third branch, the first pull-down transistor has a first channel width, the second pull-down transistor has a second channel width, and the first channel width is greater than the second channel width.

2. The level shifter of claim 1, wherein the first pull-down transistor comprises a first n-type field effect transistor (NFET) and the second pull-down transistor comprises a second NFET.

3. The level shifter of claim 2, wherein the first pull-up transistor comprises a first p-type field effect transistor (PFET) and the second pull-up transistor comprises a second PFET.

4. The level shifter of claim 1, wherein the third pull-down transistor has a third channel width, and the third channel width is greater than the second channel width.

5. The level shifter of claim 1, further comprising an output coupled to the second node.

6. The level shifter of claim 1, further comprising an inverter coupled between the first input and the second input.

7. The level shifter of claim 1, wherein the first channel width is at least 50 percent greater than the second channel width.

8. The level shifter of claim 1, wherein:
the third branch further comprises a fourth pull-up transistor configured to pull up the third node;
a gate of the third pull-up transistor is coupled to the first node; and
a gate of the fourth pull-up transistor is coupled to the second node.

9. The level shifter of claim 8, wherein the third pull-up transistor and the fourth pull-up transistor are coupled in parallel.

10. The level shifter of claim 8, wherein:
a gate of the first pull-up transistor is coupled to the third node; and
a gate of the second pull-up transistor is coupled to the third node.

11. The level shifter of claim 10, further comprising an output coupled to the second node.

12. The level shifter of claim 10, wherein the first channel width is at least 50 percent greater than the second channel width.

13. The level shifter of claim 1, wherein:
the first branch further comprises a fourth pull-up transistor coupled in series with the first pull-up transistor;
the second branch further comprises a fifth pull-up transistor coupled in series with the second pull-up transistor;
a gate of the fourth pull-up transistor is coupled to the gate of the first pull-down transistor; and
a gate of the fifth pull-up transistor is coupled to the gate of the second pull-down transistor.

14. A method for level shifting an input signal using a level shifter, the level shifter including a first branch, a second branch, and a third branch, wherein the first branch is cross coupled with the third branch, and the second branch is cross coupled with the third branch, the method comprising:
routing the input signal to the first branch and the second branch, wherein the first branch and the second branch are asymmetrical;
routing a complement of the input signal to the third branch; and
providing an output signal from a node of the second branch;
wherein:
the first branch includes a first pull-down transistor;
the second branch includes a second pull-down transistor;
the third branch includes a third pull-down transistor; and
routing the input signal to the first branch and the second branch comprises routing the input signal to a gate of the first pull-down transistor and a gate of the second pull-down transistor, wherein the first pull-down transistor has a first channel width, the second pull-down transistor has a second channel width, and the first channel width is greater than the second channel width; and
routing the complement of the input signal to the third branch comprises routing the complement of the input signal to a gate of the third pull-down transistor.

15. The method of claim 14, wherein the first channel width is at least 50 percent greater than the second channel width.

16. The method of claim 14, wherein the third pull-down transistor has a third channel width, and the third channel width is greater than the second channel width.

* * * * *